(12) United States Patent
Tseng et al.

(10) Patent No.: US 11,990,416 B2
(45) Date of Patent: May 21, 2024

(54) SEMICONDUCTOR DEVICE AND METHOD FOR MAKING THE SAME

(71) Applicant: TAIWAN SEMICONDUCTOR MANUFACTURING COMPANY, LTD., Hsinchu (TW)

(72) Inventors: Hsinhsiang Tseng, Hsinchu (TW); Chi-Ruei Yeh, Hsinchu (TW); Tsung-Yu Chiang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 221 days.

(21) Appl. No.: 17/237,874

(22) Filed: Apr. 22, 2021

(65) Prior Publication Data

US 2022/0344265 A1 Oct. 27, 2022

(51) Int. Cl.
*H01L 23/535* (2006.01)
*H01L 21/02* (2006.01)
*H01L 21/768* (2006.01)
*H01L 23/532* (2006.01)

(52) U.S. Cl.
CPC ........ *H01L 23/535* (2013.01); *H01L 21/0217* (2013.01); *H01L 21/76805* (2013.01); *H01L 21/76831* (2013.01); *H01L 21/76895* (2013.01); *H01L 23/53214* (2013.01); *H01L 23/53228* (2013.01); *H01L 23/53242* (2013.01); *H01L 23/53257* (2013.01); *H01L 23/5329* (2013.01)

(58) Field of Classification Search
CPC ......... H01L 21/76831; H01L 21/76813; H01L 21/76805; H01L 21/76895
See application file for complete search history.

(56) References Cited

U.S. PATENT DOCUMENTS

| | | | |
|---|---|---|---|
| 9,589,833 B1 * | 3/2017 | Cheng | H01L 29/4991 |
| 2018/0151445 A1 * | 5/2018 | Hsu | H01L 21/0217 |
| 2020/0035549 A1 * | 1/2020 | Wu | H01L 21/823418 |
| 2020/0098625 A1 * | 3/2020 | Yin | H01L 23/53266 |

* cited by examiner

*Primary Examiner* — Tony Tran
(74) *Attorney, Agent, or Firm* — Birch, Stewart, Kolasch & Birch, LLP

(57) ABSTRACT

A semiconductor device includes a gate structure disposed in a first dielectric layer, a conductive segment disposed in the first dielectric layer and separated from the gate structure, a second dielectric layer disposed over the first dielectric layer, a first contact penetrating the second dielectric layer and electrically connected to the gate structure, a second contact penetrating the second dielectric layer and electrically connected to the conductive segment, and a silicon nitride-based layer surrounding at least one of the first and second contacts and connected between the second dielectric layer and the at least one of the first and second contacts. A method for making the semiconductor device is also provided.

18 Claims, 21 Drawing Sheets

SEMICONDUCTOR DEVICE AND METHOD FOR MAKING THE SAME

BACKGROUND

In the semiconductor industry, there are numerous aspects of developing new generations of semiconductor devices, one of which is shrinking the dimensions of such devices. With the continuous dimensional shrinking of semiconductor devices, the middle-end-of-line (MEOL) contacts play an important role in the development because contact resistance may affect the overall performance of the semiconductor devices. In addition, reliability of semiconductor devices also depends on the structural integrity of the MEOL contacts during and after the manufacturing processes. Therefore, it is desirable in the art to provide contacts with low resistance and sufficient structural integrity.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
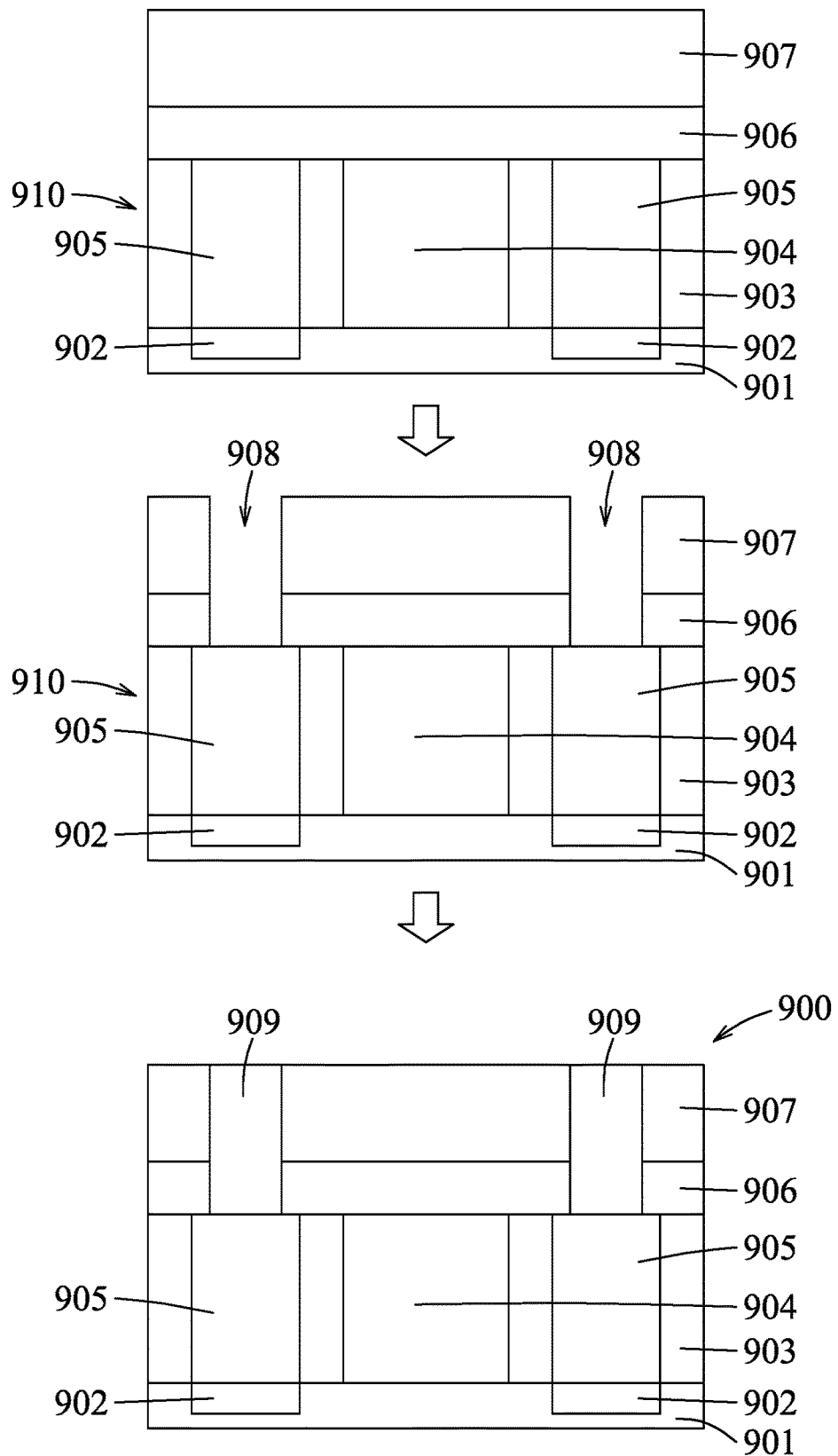
FIG. 1 illustrates schematic views of stages in the formation of a semiconductor device in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates steps of forming a semiconductor device 900 in accordance with some embodiments. First, a semiconductor feature 910 is formed. The semiconductor feature 910 may include a semiconductor substrate 901, two source/drain regions 902 formed in the semiconductor substrate 901 and separated from each other, a first dielectric layer 903 formed over the semiconductor substrate 901, two conductive segments 905 formed in the first dielectric layer 903 and respectively connected to the source/drain regions 902, and a gate structure 904 formed in the first dielectric layer 903 and disposed between the conductive segments 905. Subsequently, a second dielectric layer 906 is formed over the first dielectric layer 903, and a third dielectric layer 907 is formed over the second dielectric layer 906. Afterwards, two openings 908 are formed in the second and third dielectric layers 906, 907, such that the conductive segments 905 are respectively exposed from the openings 908. In some embodiments, the second dielectric layer 906 may serve as an etch stop layer for forming the openings 908. After the formation of the openings 908, two contacts 909 are respectively formed in the openings 908 and are respectively and electrically connected to the conductive segments 905, thereby obtaining the semiconductor device 900. In some embodiments, the contacts 909 may be made of Ru or other suitable materials. In some embodiments, each of the contacts 909 may be provided with a liner (not shown) that is connected between the contact 909 and the third dielectric layer 907. In some embodiments, the liner may be made of Ta, TaN, a combination thereof, or other suitable materials. However, in some embodiments, the dimension of the openings 908 may need to be increased such that the overall resistance of the liner and the corresponding contact 909 may be low enough for certain applications. In some embodiments, the liner may have a resistivity ranging from about $10^2$ ohm-cm to about $10^5$ ohm-cm. In some embodiments, the liner may be omitted for reducing the resistance of a contact, and allows a contact opening to be made smaller.

In accordance with some embodiments, multiple structures of semiconductor devices are proposed for obtaining a MEOL contact with small dimension, superior adhesion to a surrounding dielectric layer, and superior breakdown voltage.

Figure 2:
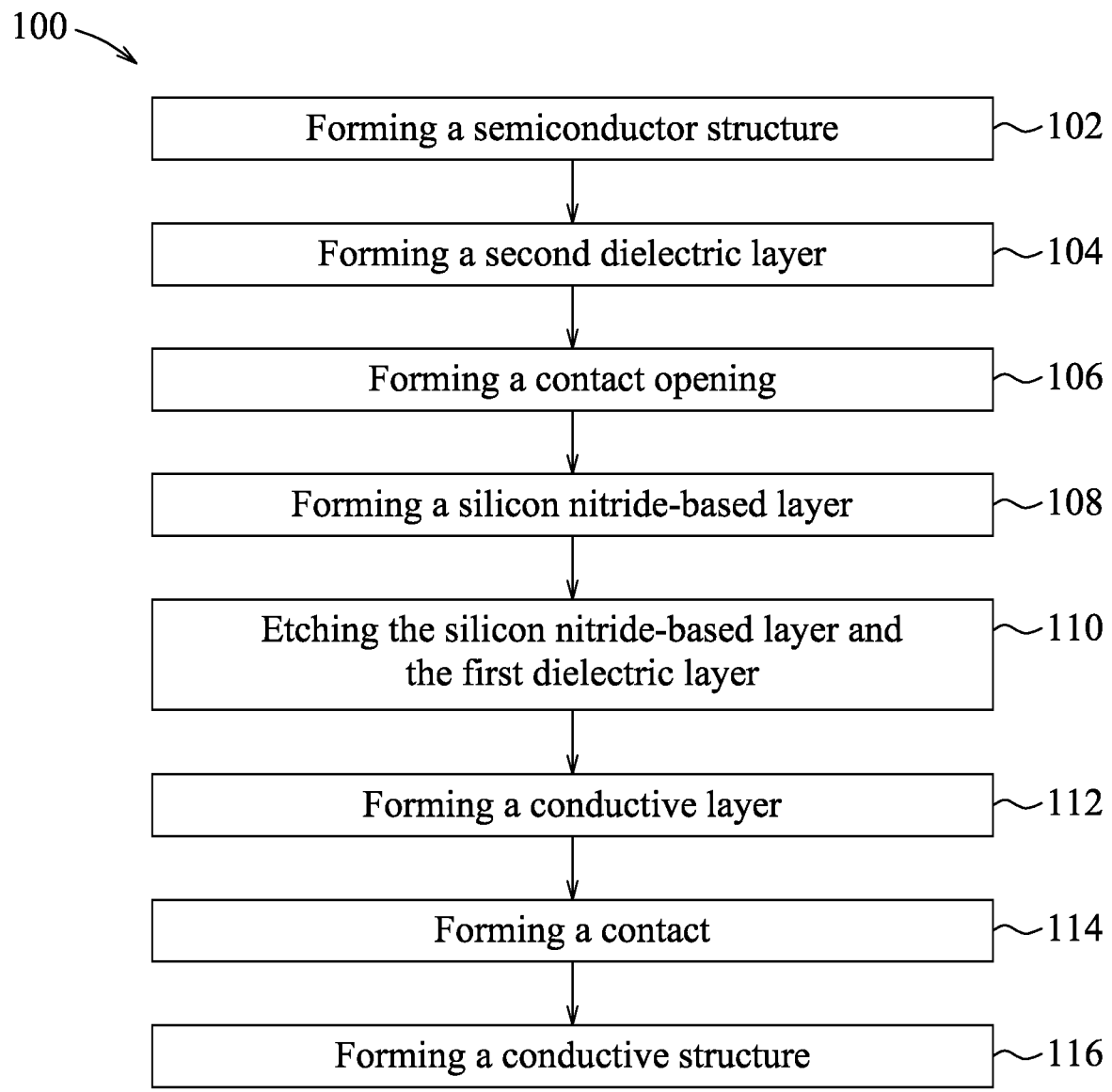
FIG. 2 is a process flow for making a semiconductor device in accordance with some embodiments.

FIG. 2 shows a flow chart 100 illustrating a method of forming a semiconductor device 300 (see FIG. 10) in accordance with some embodiments. FIGS. 3 to 10 illustrate intermediate steps of forming the semiconductor device 300.

Figure 3:
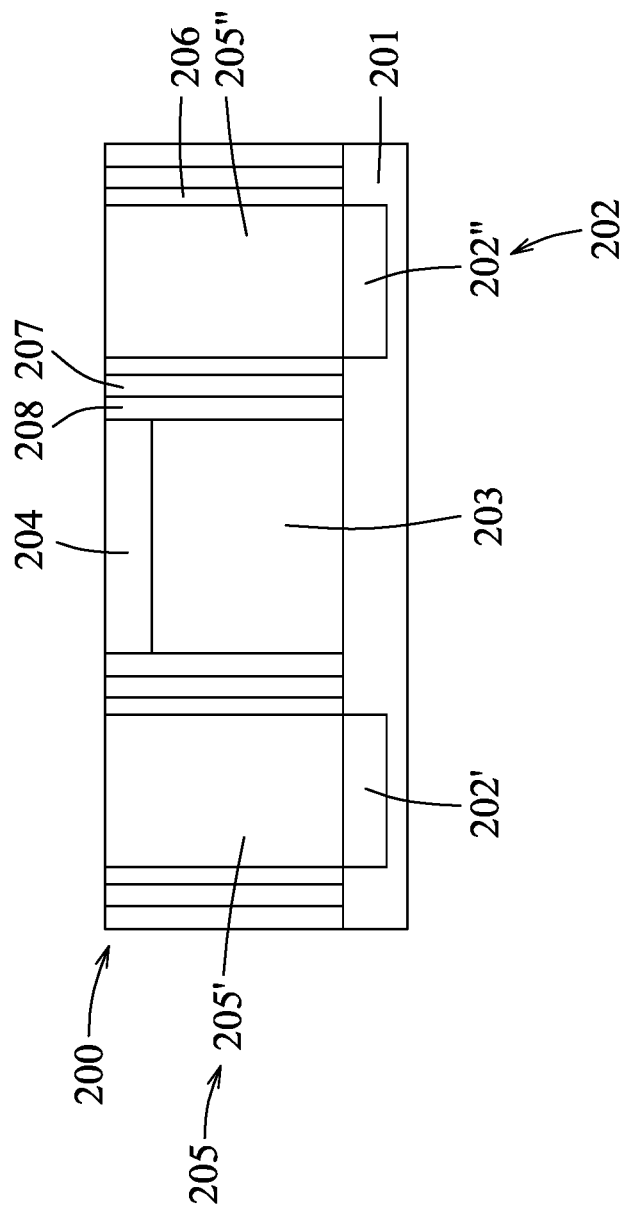
FIGS. 3 to 10 illustrate schematic views of stages in the formation of a semiconductor device in accordance with some embodiments.

FIG. 3 illustrates that a semiconductor structure 200 is formed. This process is illustrated as process 102 in the flow chart 100 shown in FIG. 2. In accordance with some embodiments, the semiconductor structure 200 includes a semiconductor substrate 201, a source/drain region 202 formed in the semiconductor substrate 201, a gate structure 203 disposed on the semiconductor substrate 201 in a first dielectric layer 207, a conductive segment 205 which is disposed on the semiconductor substrate 201, in the first dielectric layer 207 and which is electrically connected to the source/drain region 202. The first dielectric layer 207 may be made of a suitable dielectric material. In some embodiments, a spacer 208 may be formed on a side wall of the gate structure 203, and a hard mask 204 may be formed on the gate structure 203. In some embodiments, the conductive segment 205 may be provided with a liner 206. It should be noted that the source/drain region 202 illustrated in FIG. 3 may have a source region 202' and a drain region 202" that are separated from each other, and are collectively referred to as the source/drain region 202 for the sake of brevity. Similarly, the conductive segment 205 illustrated in FIG. 3 may have a first conductive segment 205' electrically connected to the source region 202' and a second conductive segment 205" electrically connected to the drain region 202". The first conductive segment 205' and the second conductive segment 205" are collectively referred to as the conductive segment 205 for the sake of brevity. In some embodiments, a top surface of the hard mask 204 is coplanar with a top surface of the conductive segment 205; in other embodiments, the top surface of the hard mask 204 and the top surface of the conductive segment 205 are not coplanar.

In some embodiments, the semiconductor substrate 201 may be a suitable substrate, such as an elemental semiconductor or a compound semiconductor. The elemental semiconductor may contain a single species of atom, such as silicon (Si), germanium (Ge) or other suitable materials, e.g., other elements from column 14 of the periodic table. The compound semiconductor may be composed of at least two elements, such as gallium arsenide (GaAs), silicon carbide (SiC), silicon germanium (SiGe), gallium phosphide (GaP), indium antimonide (InSb), indium arsenide (InAs), indium phosphide (InP), gallium arsenide phosphide (GaAsP), gallium indium phosphide (GaInP), gallium indium arsenide (GaInAs), aluminum gallium arsenide (AlGaAs), aluminum indium arsenide (AlInAs), gallium indium arsenide phosphide (GaInAsP), or the like. In some embodiments, the composition of the compound semiconductor may change from one ratio at one location to another ratio at a different location (i.e., the compound semiconductor may have a gradient composition). In some embodiments, the semiconductor substrate 201 may be a semiconductor-on-insulator (SOI) substrate, such as silicon germanium-on-insulator (SGOI) substrate, or the like. In some embodiments, an SOI substrate may include an epitaxially grown semiconductor layer, including Si, Ge, SiGe, any combination thereof, or the like, which is formed over an oxide layer.

In some embodiments, the semiconductor structure 200 may be a three-dimensional device, such as a fin field-effect transistor (FinFET), and the semiconductor substrate 201 illustrated in FIG. 3 may be a fin structure of the FinFET which may be a part of a semiconductor substrate or which may be epitaxially grown from the semiconductor substrate. In some embodiments, the source/drain region 202 may be formed by doping the semiconductor substrate 201 using a suitable technique, such as ion implantation or the like. In other embodiments, the source/drain region 202 may be a raised structure grown in a recess (not shown) formed in the semiconductor substrate 201 using a suitable technique, such as epitaxial growth or the like. In some embodiments, a silicide layer (not shown) may be formed in a top portion of the source/drain region 202 for lowering resistance between the source/drain region 202 and the conductive segment 205. The silicide layer may include titanium silicide, cobalt silicide, nickel silicide, tungsten silicide, tantalum silicide, palladium silicide, erbium silicide, platinum silicide, or other suitable metal silicide materials.

In some embodiments, the gate structure 203 may include at least one conductive layer (not shown) made of metal, such as Cu, W, Al, Ta, Ti, TaN, TiN, TiAl, TiAlC, TiAlN, NiSi, CoSi, any combination thereof, or other suitable conductive materials. In some embodiments, the gate structure 203 may further include at least one gate dielectric layer (not shown), which may be made of a suitable metal oxide, such as the oxide of Li, Be, Pr, Ce, La, Al, Hf, Zr, Y, Sc, Sr, Ca, Mg, Nd, Sm, Eu, Gd, Lu, Yb, Tm, Er, Ho, Dy, Tb, any combination thereof, or the like. In some embodiments, the gate structure 203 may further include at least one work function adjustment layer. When the semiconductor structure 200 is an n-channel FET, the work function adjustment layer may include TiSi, TaSi, HfTi, TiAl, Co, TiC, TiN, TaAlC, TaN, any combination thereof, or other suitable materials for tuning the work function of the gate structure 203. When the semiconductor structure 200 is a p-channel FET, the work function adjustment layer may include Co, TiC, TiN, TaN, TaAlC, TiAl, Al, TiAlC, any combination thereof, or other suitable materials for tuning the work function of the gate structure 203. The hard mask 204 may be made of oxide of nitride materials, such as SiN, or other suitable materials.

In some embodiments, the spacer 208 may be made of a suitable material, such as SiN, SiC, SiON, SiOCN, SiCN, any combination thereof, or the like. In some embodiments, the spacer 208 may include multiple sub-layers that are made of the same or different materials according to practical requirements.

In some embodiments, the conductive segment 205 may be made of a suitable material, such as Co, W, Ru, Ti, Ta, any combination thereof, or the like. The liner 206 may be made of a suitable material, such as Ti, TiN, Ta, TaN, any combination thereof, or the like.

Figure 4:
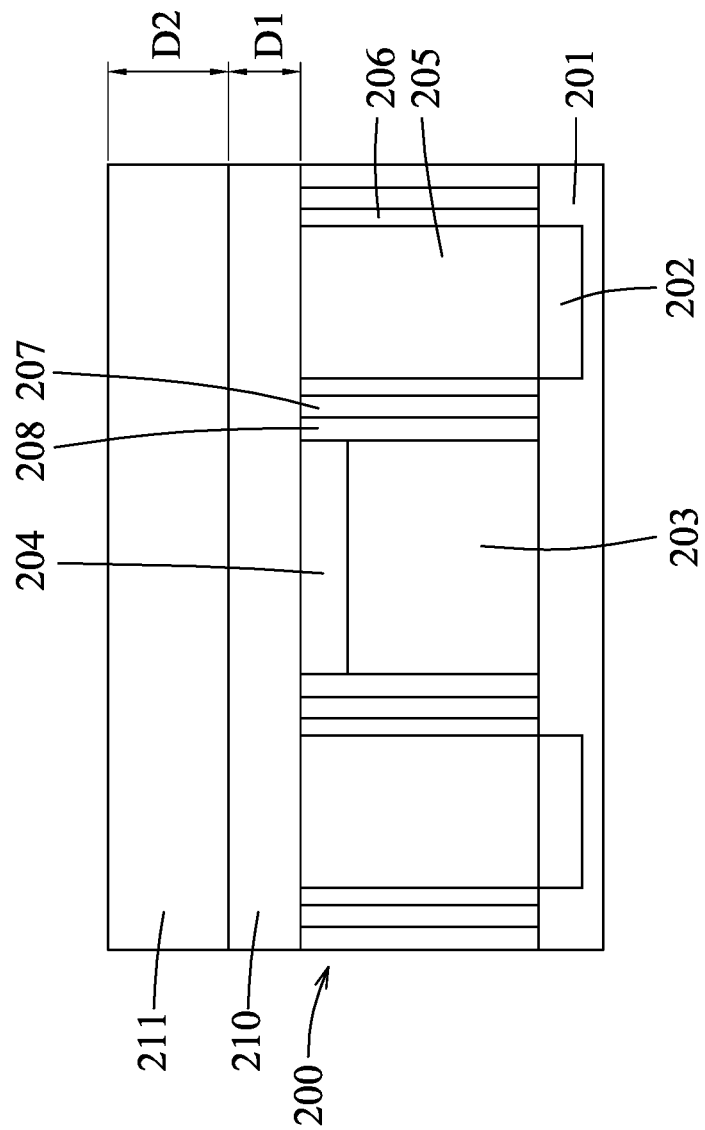

Referring to FIG. 4, after the formation of the semiconductor structure 200, a second dielectric layer 211 may be formed over the semiconductor structure 200. This process is illustrated as process 104 in the flow chart 100 shown in FIG. 2. In some embodiments, an etch stop layer 210 may be formed between the semiconductor structure 200 and the second dielectric layer 211. The etch stop layer 210 may serve as an etch stop layer for a process of forming a contact opening 212 (see FIG. 5), which will be described in more detail hereinafter. The etch stop layer 210 may be made of a suitable material, such as SiN, SiCN, SiOCN, any combination thereof, or the like. The second dielectric layer 211 may be used for a contact 214 (see FIG. 9, which will be described in more detail hereinafter) to be formed therein. The second dielectric layer 211 may be made of a suitable dielectric material, such as silicon oxide, silicon nitride, silicon carbide (including undoped silicon carbide (UDC), oxygen-doped silicon carbide (ODC), nitrogen-doped silicon carbide (NDC), or the like), silicon oxynitride, silicon oxycarbide (including SiOCH), silicon carbonitride, silicon oxycarbide nitride, aluminum oxide, aluminum oxynitride, aluminum nitride, zirconium oxide, zirconium oxynitride, amorphous silicon, any combination thereof, or the like. Each of the etch stop layer 210 and the second dielectric layer 211 may be formed by a suitable process, such as chemical vapor deposition (CVD) (e.g., flowable CVD (FCVD), low pressure CVD (LPCVD), plasma enhanced CVD (PECVD), or the like), physical vapor deposition (PVD), atomic layer deposition (ALD), spin-on coating, any combination thereof, or other suitable techniques. In some embodiments, a thickness (D1) of the etch stop layer 210 may be equal to or less than about 30 nm, and other range values are also within the scope of this disclosure. In some embodiments, a thickness (D2) of the second dielectric layer 211 may be equal to or less than about 20 nm, and other range values are also within the scope of this disclosure. In some embodiments, the thickness (D1) of the etch stop layer 210 equals the thickness (D2) of the second dielectric layer 211; in other embodiments, the thickness (D1) of the etch stop layer 210 is not equal to the thickness (D2) of the second dielectric layer 211.

Figure 5:
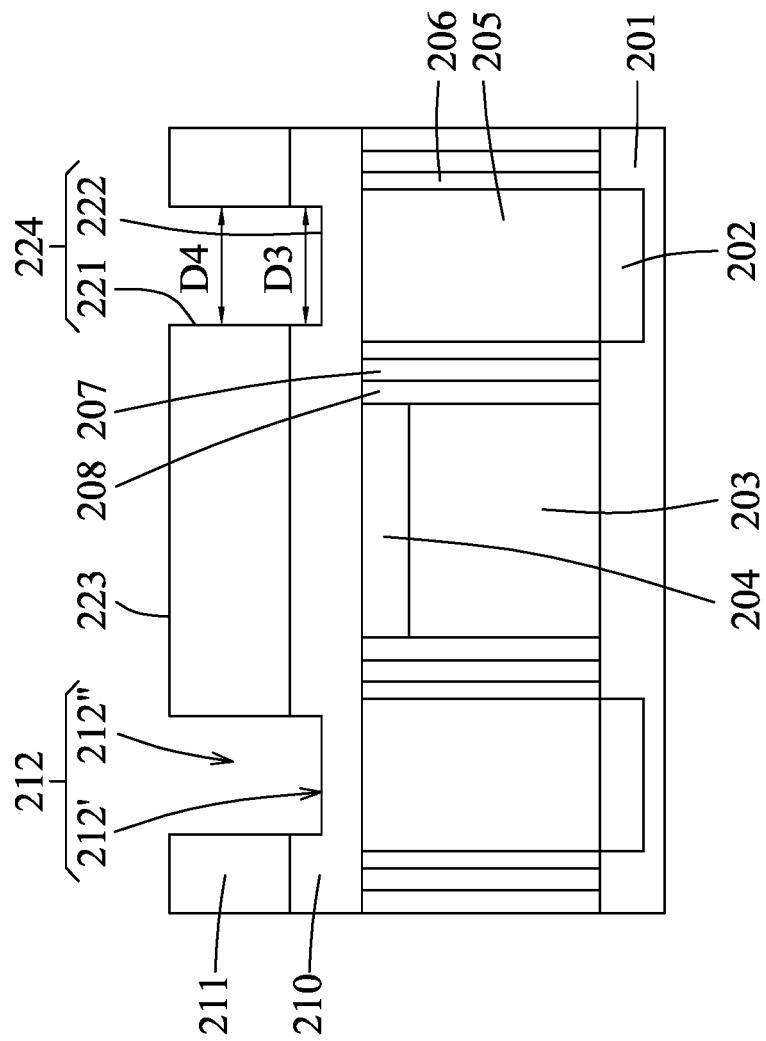

Referring to FIG. 5, after the formation of the second dielectric layer 211, the contact opening 212 is formed in the second dielectric layer 211 and the etch stop layer 210. This process is illustrated as process 106 in the flow chart 100 shown in FIG. 2. In some embodiments, the contact opening 212 may be formed by a suitable technique, such as wet chemical etching, dry etching, physical bombardment, any combination thereof, or the like. In accordance with some embodiments, a photoresist (not shown) may be used for etching the second dielectric layer 211 and the etch stop layer 210 to form the contact opening 212. The photoresist may be formed over the second dielectric layer 211, followed by patterning the photoresist with a pre-determined mask. The photoresist may be made of a photosensitive material which undergoes a property change when exposed to a light (e.g., a radiation light from a light source) passing through the pre-determined mask. Therefore, a layout pattern of the pre-determined mask is transferred to the photoresist. In some embodiments, the photoresist may be patterned by a direct writing technique (e.g., using a laser light source, an ion-beam source, or the like) without using the pre-determined mask. After the photoresist is exposed, the photoresist is developed leaving either the exposed portion of the photoresist or the unexposed portion of the photoresist. The developed photoresist can then be used for etching the second dielectric layer 211 and the etch stop layer 210. In some embodiments, before and after the exposure and development of the photoresist, multiple baking and rinsing steps may be carried out on the photoresist, depending on practical requirements.

The contact opening 212 may be defined by a side wall 221 constituted by the second dielectric layer 211 and the etch stop layer 210, and a bottom wall 222 constituted by the etch stop layer 210. The side wall 221 and the bottom wall 222 may be collectively referred to as a hole-defining wall 224 which is constituted by the second dielectric layer 211 and the etch stop layer 210 and which defines the contact opening 212. In some embodiments, the etching process may be conducted such that the contact opening 212 penetrates the second dielectric layer 211 and stops at the etch stop layer 210. In some embodiments, a width (D3) of the contact opening 212 defined by the etch stop layer 210 may range from about 1 nm to about 100 nm, and other range values are also within the scope of this disclosure. In some embodiments, a width (D4) of the contact opening 212 defined by the second dielectric layer 211 may range from about 1 nm to about 100 nm, and other range values are also within the scope of this disclosure. In other words, the contact opening 212 may be divided into a first portion 212' formed in the etch stop layer 210 and having the width (D3), and a second portion 212" formed in the second dielectric layer 211 and having the width (D4). In some embodiments, the width (D3) of the first portion 212' equals the width (D4) of the second portion 212"; in other embodiments, the width (D3) of the first portion 212' is smaller than the width (D4) of the second portion 212". In some embodiments, the technique used for etching the second dielectric layer 211 and the etch stop layer 210 to form the contact opening 212 is controlled to avoid forming a profile having D3 larger than D4 (also known as a necking profile, which may adversely affect the subsequent deposition and etching steps).

Figure 6:
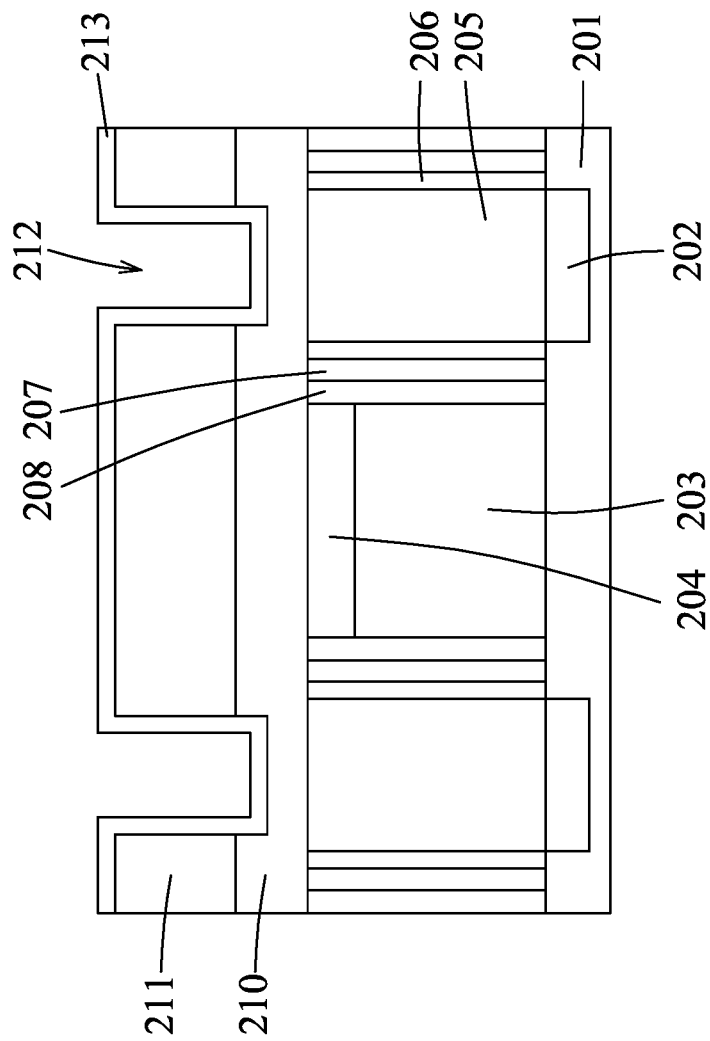

Referring to FIG. 6, with reference to FIG. 5, after the formation of the contact opening 212, a silicon nitride-based layer 213 is formed. This process is illustrated as process 108 in the flow chart 100 shown in FIG. 2. The silicon nitride-based layer 213 may be conformally formed on a top surface 223 of the second dielectric layer 211, the side wall 221 and the bottom wall 222 by a suitable technique, such as CVD, ALD, a combination thereof, or the like. In other words, the silicon nitride-based layer 213 may be conformally formed on the top surface 223 of the second dielectric layer 211 and the hole-defining wall 224. The silicon nitride-based layer 213 may be made of a suitable material, such as SiN, SiON, SiCN, SiCON, any combination thereof, or the like. In some embodiments, the silicon nitride-based layer 213 and the etch stop layer 210 may be made of the same material; in other embodiments, the silicon nitride-based layer 213 and the etch stop layer 210 may be made of different materials. In some embodiments, the silicon nitride-based layer 213 may have a resistivity ranging from about $10^6$ ohm-cm to about $10^{15}$ ohm-cm, but other range values are also within the scope of this disclosure.

Figure 7:
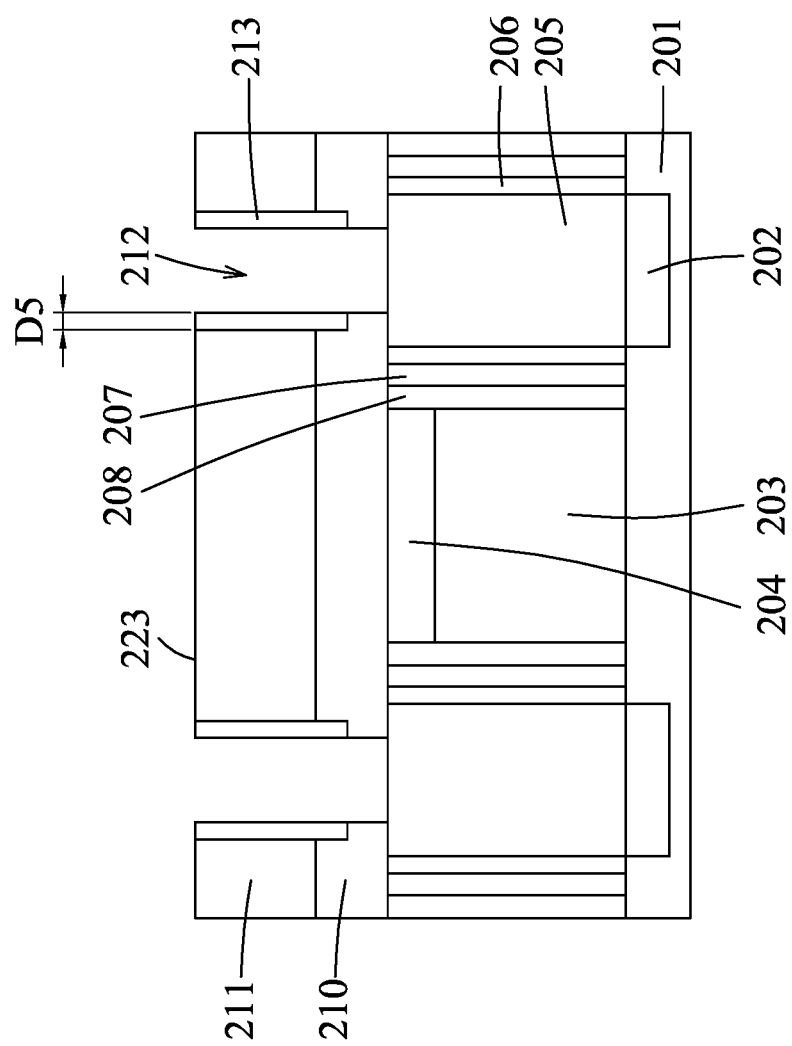

Referring to FIG. 7, with reference to FIG. 5, after the formation of the silicon nitride-based layer 213, the silicon nitride-based layer 213 and the etch stop layer 210 are etched. This process is illustrated as process 110 in the flow chart 100 shown in FIG. 2. In some embodiments, the silicon nitride-based layer 213 on the top surface 223 of the second dielectric layer 211 and on the bottom wall 222 are etched away, and a portion of the etch stop layer 210 is etched away such that the contact opening 212 extends through the etch stop layer 210, so as to expose the conductive segment 205. The etching process may be conducted by a suitable technique, such as anisotropic dry etch or the like. In some embodiments, the conductive segment 205 may be over-etched (i.e., a top portion of the conductive segment 205 may be slightly removed due to over-etch). The degree and profile of over-etch may be controlled according to practical requirements. In some embodiments, a thickness (D5) of the silicon nitride-based layer 213 may range from about 0.1 nm to about 10 nm. The silicon nitride-based layer 213 may improve adhesion between the subsequently formed contact 214 (see FIG. 9) and the second dielectric layer 211. In addition, the silicon nitride-based layer 213 may also serve as an anti-breakdown layer for the contact 214. If the thickness (D5) of the silicon nitride-based layer 213 is less than about 0.1 nm, the effects of adhesion improvement and anti-breakdown may be adversely affected. If the thickness (D5) of the silicon nitride-based layer 213 is greater than about 10 nm, the overall resistance of the semiconductor device 300 (see FIG. 10) may increase and the process of forming the contact opening 212 may also be adversely affected. In some embodiments, in the cross-sectional view, the contact opening 212 may have a shape of a rectangle or an inverted trapezoid, but other shapes are also within the scope of this disclosure.

Figure 8:
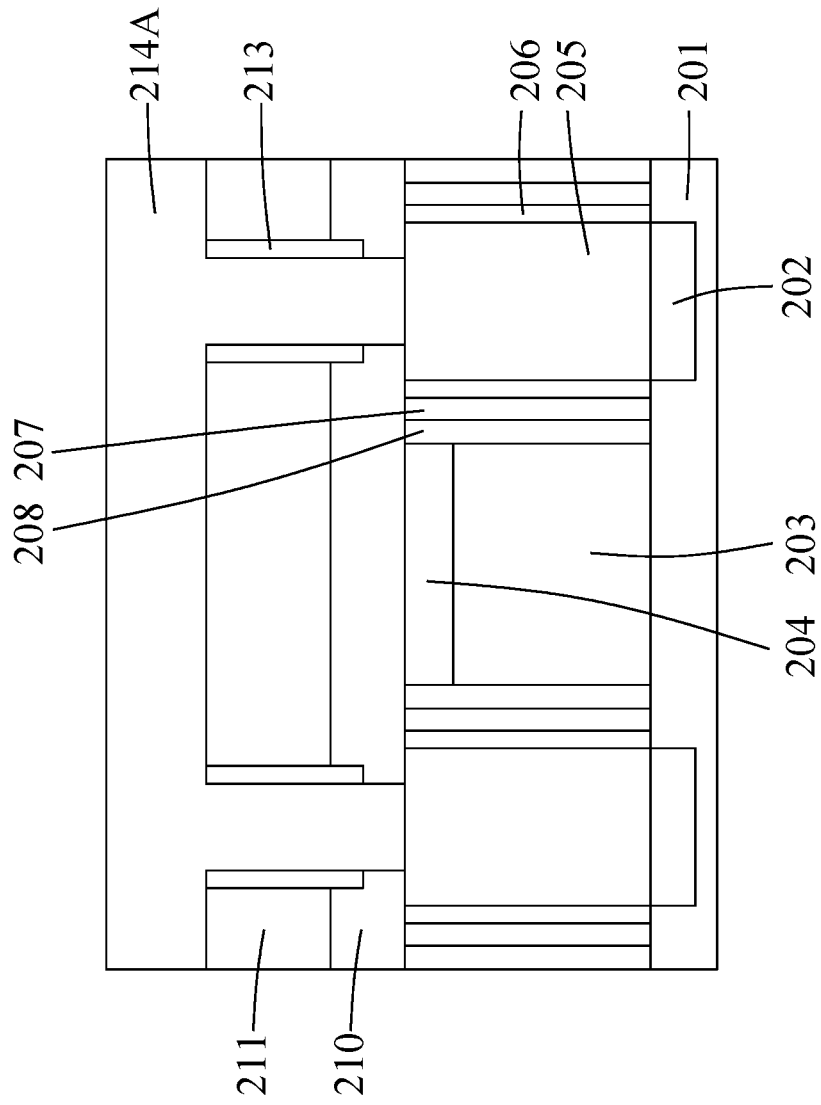

Referring to FIG. 8 with reference to FIG. 7, after performing the process of etching the silicon nitride-based layer 213 and the etch stop layer 210, a conductive layer 214A is deposited on the second dielectric layer 211 and in the contact opening 212. This process is illustrated as process 112 in the flow chart 100 shown in FIG. 2. In some embodiments, the conductive layer 214A may be made of Ru, Rh, Ir, Co, W, Ta, TiN, TiW, Al, TaN, or Cu, any combination thereof, or other suitable materials. In some embodiments, the conductive layer 214A may be formed by a suitable technique, such as ALD, CVD, PVD, or the like.

Figure 9:
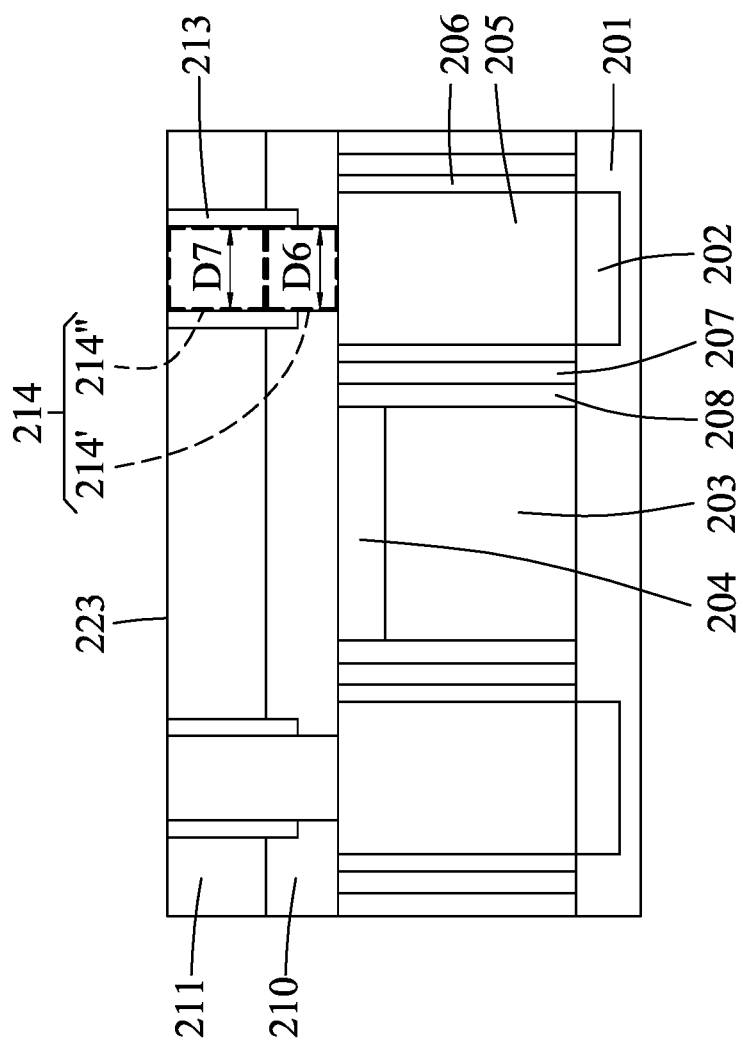

Referring to FIG. 9, with reference to FIG. 8, after the conductive layer 214A is formed, a part of the conductive layer 214A is removed to form the contact 214 in the contact opening 212 (see FIG. 7). This process is illustrated as process 114 in the flow chart 100 shown in FIG. 2. In some embodiments, the part of the conductive layer 214A is removed by a suitable technique, such as chemical mechanical planarization (CMP) or the like. FIG. 9 also illustrates that top portions of the second dielectric layer 211, the silicon nitride-based layer 213 and the conductive layer 214A in the contact opening 212 may also be removed. The height of the contact 214 may be adjusted according to practical requirements. In some embodiments, the contact 214 may be divided into a first portion 214' that is formed in the etch stop layer 210, and a second portion 214" that is formed in the second dielectric layer 211. In some embodiments, the silicon nitride-based layer 213 surrounds the second portion 214", and surrounds a part of the first portion 214'. In some embodiments, a width (D6) of the first portion 214' is not greater than a width (D7) of the second portion 214".

Figure 10:
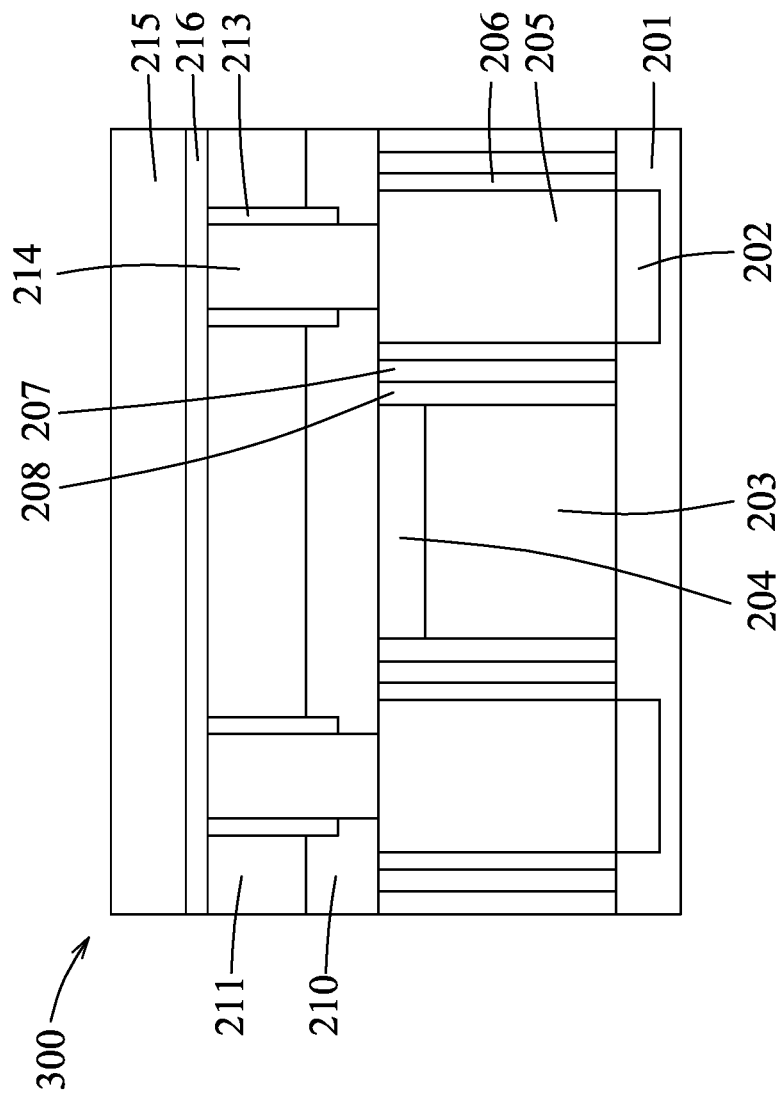

Referring to FIG. 10, after performing process 114 in the flow chart 100 shown in FIG. 2, a conductive structure 215 is formed to be electrically connected to the contact 214, thereby obtaining the semiconductor device 300. This process is illustrated as process 116 in the flow chart 100 shown in FIG. 2. In some embodiments, a third dielectric layer 240 (see FIG. 11) may be formed over the second dielectric layer 211, followed by etching the third dielectric layer 240 and forming the conductive structure 215 in the etched part of the third dielectric layer 240. In some embodiments, the conductive structure 215 may be referred to as a first metal layer (M0 layer), and may be made of a suitable material, such as Cu, Ru, W, Ti, Al, Co, Mo, Ir, Rh, any combination thereof, or the like, and may be formed by a suitable technique, such as PVD, CVD, ALD, electroless deposition (ELD), a combination of PVD and electrochemical plating (ECP), or the like. In some embodiments, before the formation of the conductive structure 215, a glue layer 216 may be formed. The glue layer 216 may be made of a suitable material, such as Ta, TaN, Co, Ru, Ti, TiN, $Mg_3N_2$, W, Al, Mo, Ir, Rh, graphene, any combination thereof, or the like, and may be made of a suitable technique, such as PVD, CVD, ALD, or the like. In some embodiments, the glue layer 216 may be replaced with a silicon nitride-based layer which may be made of a suitable material, such as SiN, SiON, SiCN, SiCON, any combination thereof, or the like.

Figure 11:
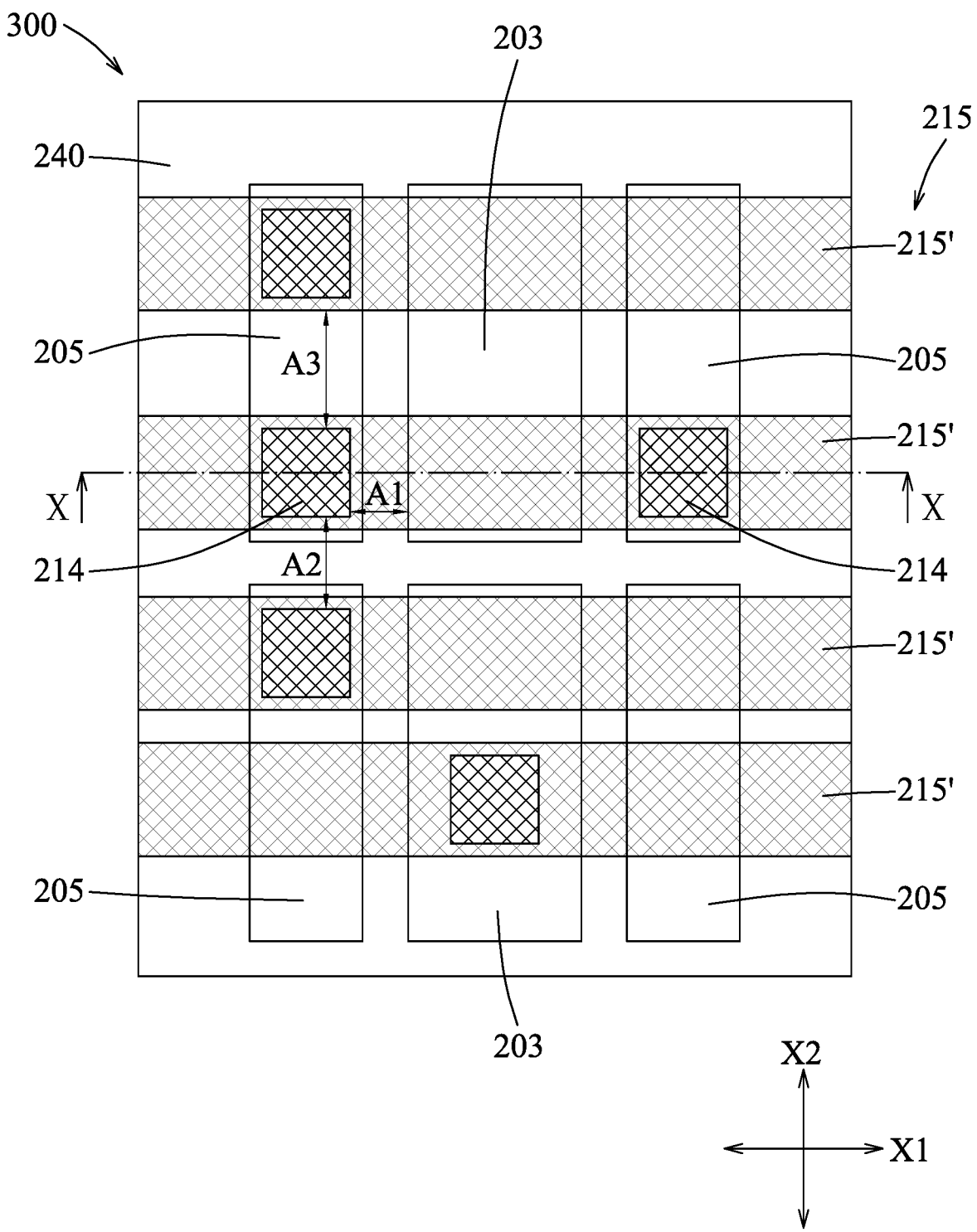
FIG. 11 is a schematic top view showing an arrangement of a semiconductor device in accordance with some embodiments.

FIG. 11 is a schematic top view showing that the conductive structure 215 having a plurality of conductive portions 215' being electrically and correspondingly connected to a plurality of the conductive segments 205 through the contacts 214. The sectional view of FIG. 10 is taken from line X-X of FIG. 11. In some embodiments, referring to the upper part or the lower part of FIG. 11, the conductive segments 205 and the gate structure 203 may be arranged in a first direction (X1). FIG. 11 also shows that the conductive portions 215' may extend along the first direction (X1), and may be arranged in a second direction (X2) which may be substantially perpendicular to the first direction (X1). It should be noted that the numbers and arrangements of the conductive portions 215', the conductive segments 205, the contacts 214, the gate structures 203 may be changed based on practical requirements. The silicon nitride-based layer 213 (see FIG. 10) may serve as an anti-breakdown layer for preventing via-to-gate breakdown (denoted by A1 in FIG. 11), via-to-via breakdown (denoted by A2 in FIG. 11) and via-to-M0 breakdown (denoted by A3 in FIG. 11).

Figure 12:
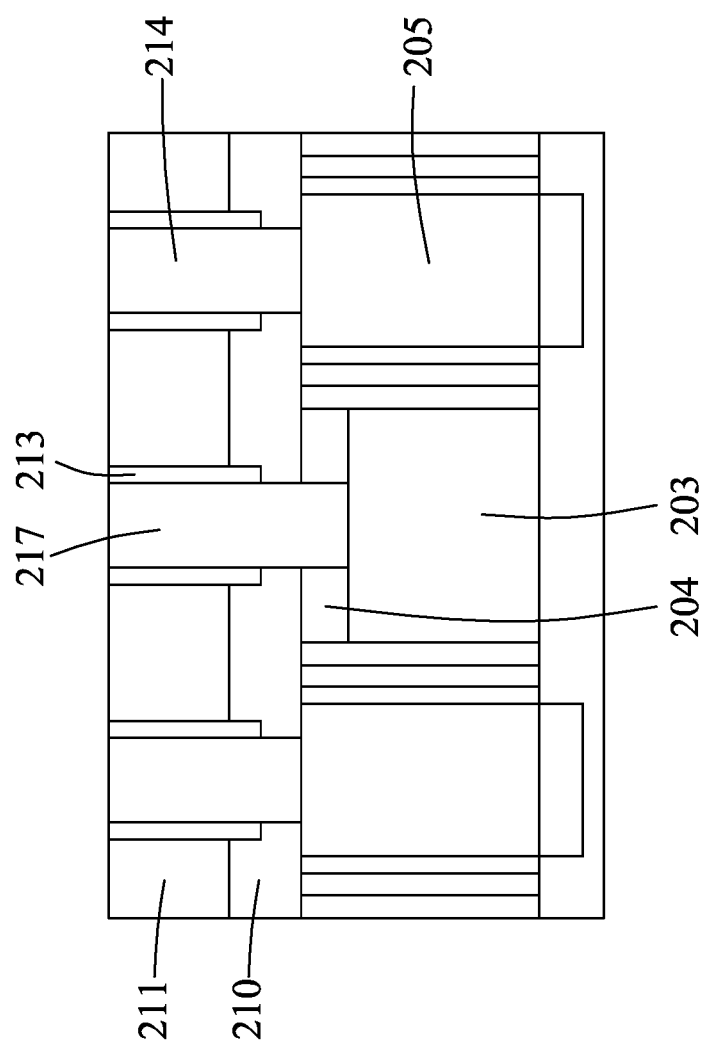
FIG. 12 is a schematic sectional view of a semiconductor device in accordance with some embodiments.

FIG. 12 is a schematic sectional view showing that a gate conductive layer 217 is formed to be electrically connected to the gate structure 203. The silicon nitride-based layer 213 may also be formed to partially surround the gate conductive layer 217 and to be connected between the gate conductive layer 217 and the second dielectric layer 211, thereby improving the adhesion between the gate conductive layer 217 and the second dielectric layer 211 and serving as an anti-breakdown layer for the gate conductive layer 217. In some embodiments, the silicon nitride-based layer 213 partially surrounding the gate conductive layer 217 may have a width ranging from about 0.1 nm to about 10 nm.

Figure 13:
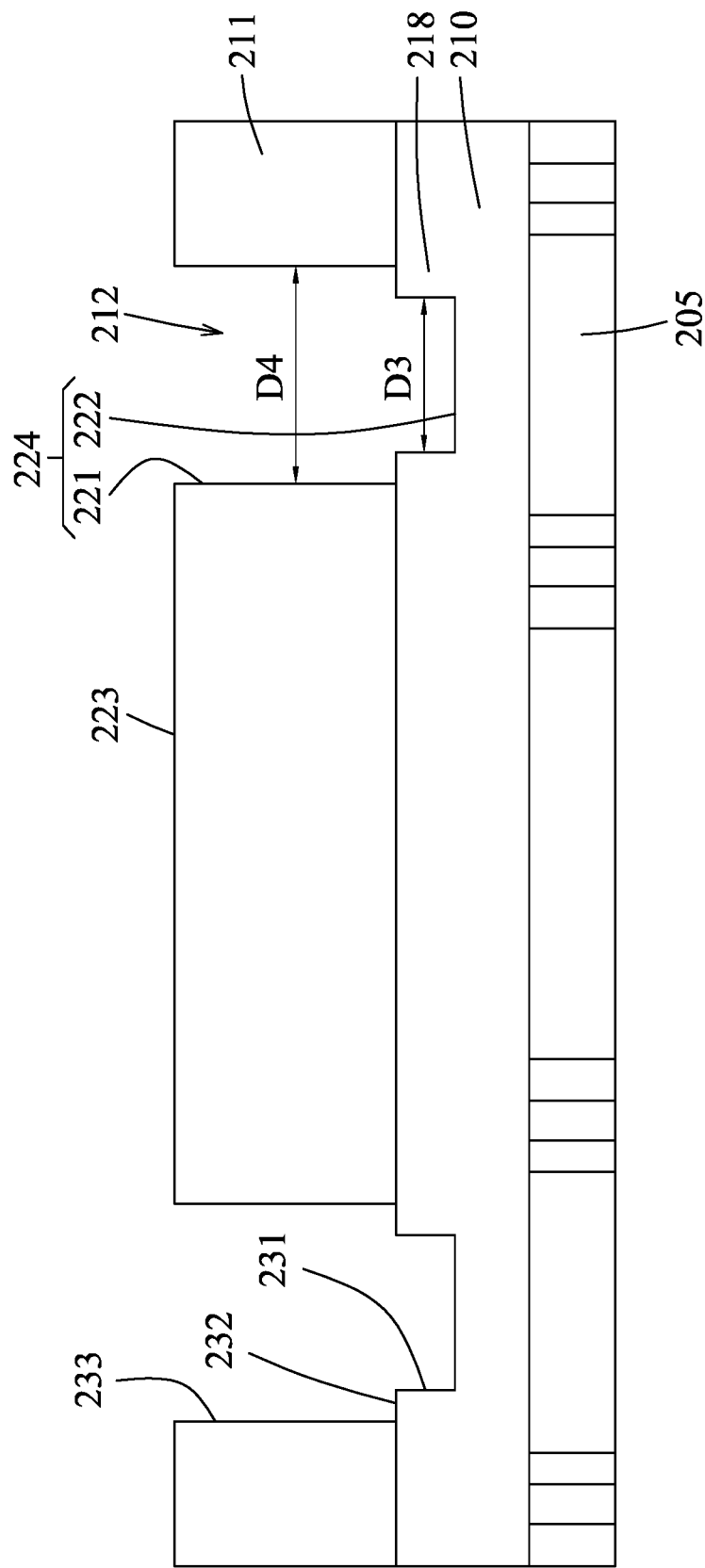
FIGS. 13 to 17 illustrate schematic views of stages in the formation of a semiconductor device in accordance with some embodiments.

FIG. 13 is an enlarged schematic sectional view showing that, in the step of forming the contact opening 212 in the second dielectric layer 211 and the etch stop layer 210 (i.e., process 106 in the flow chart 100 shown in FIG. 2), the width (D4) of the contact opening 212 defined by the second dielectric layer 211 may be greater than the width (D3) of the contact opening 212 defined by the etch stop layer 210, such that the etch stop layer 210 has a step portion 218 which defines the width (D3) of the contact opening 212. The side wall 221 of the hole-defining wall 224 thus has a stepped profile. Such profile may be the result of a meticulous etch process tuning, difference in etch resistivity of the second dielectric layer 211 and the etch stop layer 210, a combination thereof, or other factors. The side wall 221 with the stepped profile has a first wall portion 231 formed by the etch stop layer 210, a shoulder portion 232 formed by an upper surface of the etch stop layer 210, and a second wall portion 233 formed by the second dielectric layer 211. The shoulder portion 232 interconnects and transversely extend between the first and second wall portions 231, 233.

Figure 14:
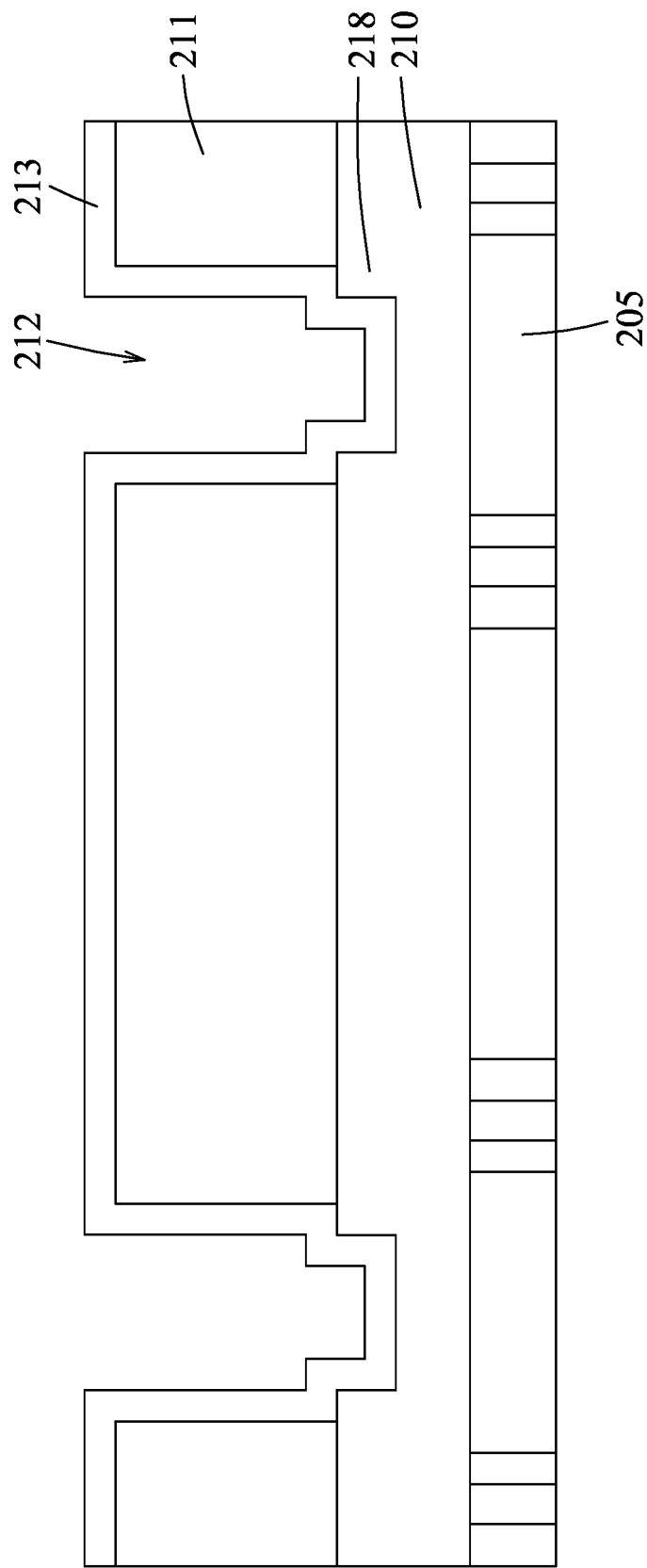

Referring to FIG. 14, with reference to FIG. 13, subsequent to the process shown in FIG. 13, the silicon nitride-based layer 213 is formed (i.e., process 108 in the flow chart 100 shown in FIG. 2). The silicon nitride-based layer 213 is formed on the top surface 223 of the second dielectric layer 211, the side wall 221 having the stepped profile, and the bottom wall 222.

Figure 15:
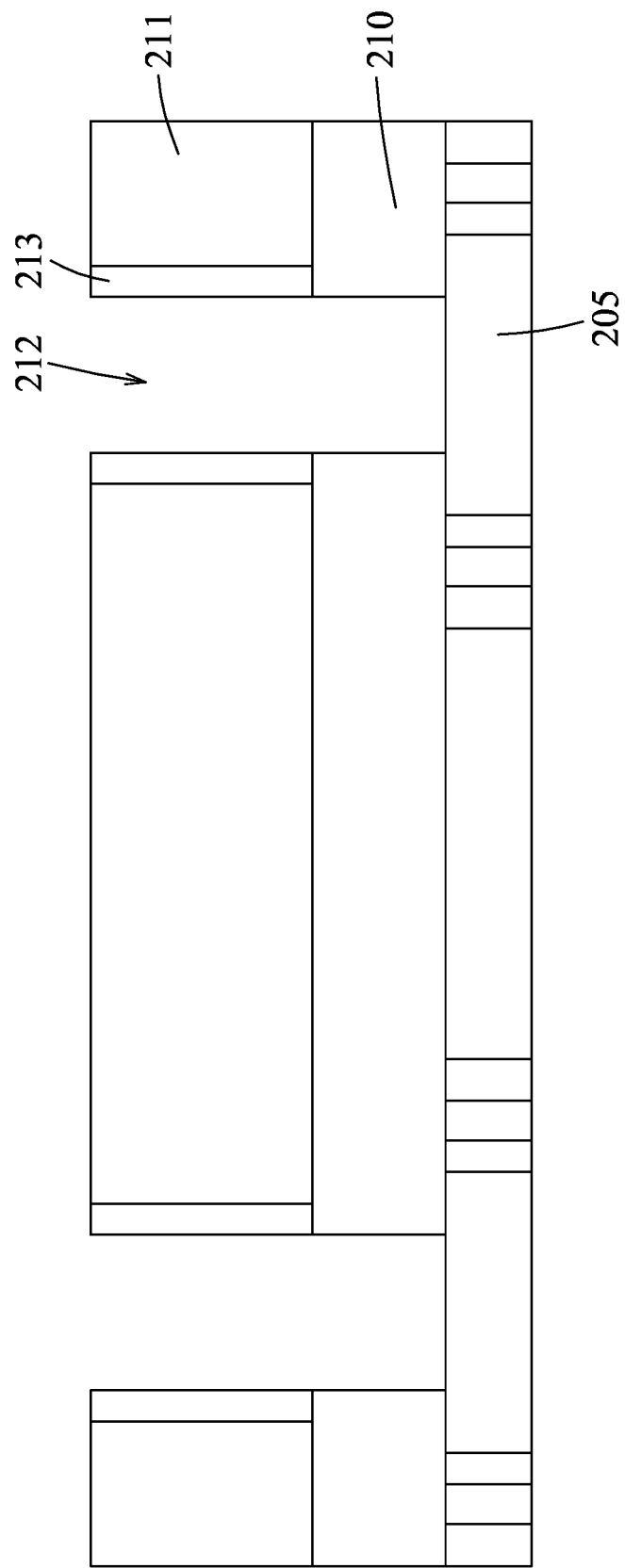

Referring to FIG. 15, subsequent to the process shown in FIG. 14, the silicon nitride-based layer 213 and the etch stop layer 210 are etched (i.e., process 110 in the flow chart 100 shown in FIG. 2). In some embodiments, the silicon nitride-based layer 213 which is formed on the top surface 223 of the second dielectric layer 211 (see FIG. 13), which is formed on the shoulder portion 232 and the first wall portion 231 of the side wall 221 (see FIG. 13), and which is formed on the bottom wall 222 (see FIG. 13), are etched away. In addition, in some embodiments, the step portion 218 (see FIG. 13) and a portion of the etch stop layer 210 underneath the contact opening 212 are etched away such that the contact opening 212 extends through the etch stop layer 210 to expose the conductive segment 205. In some embodiments, the step portion 218 may not be removed, and the conductive segment 205 is exposed from a part of the contact opening 212 surrounded by the step portion 218.

Figure 16:
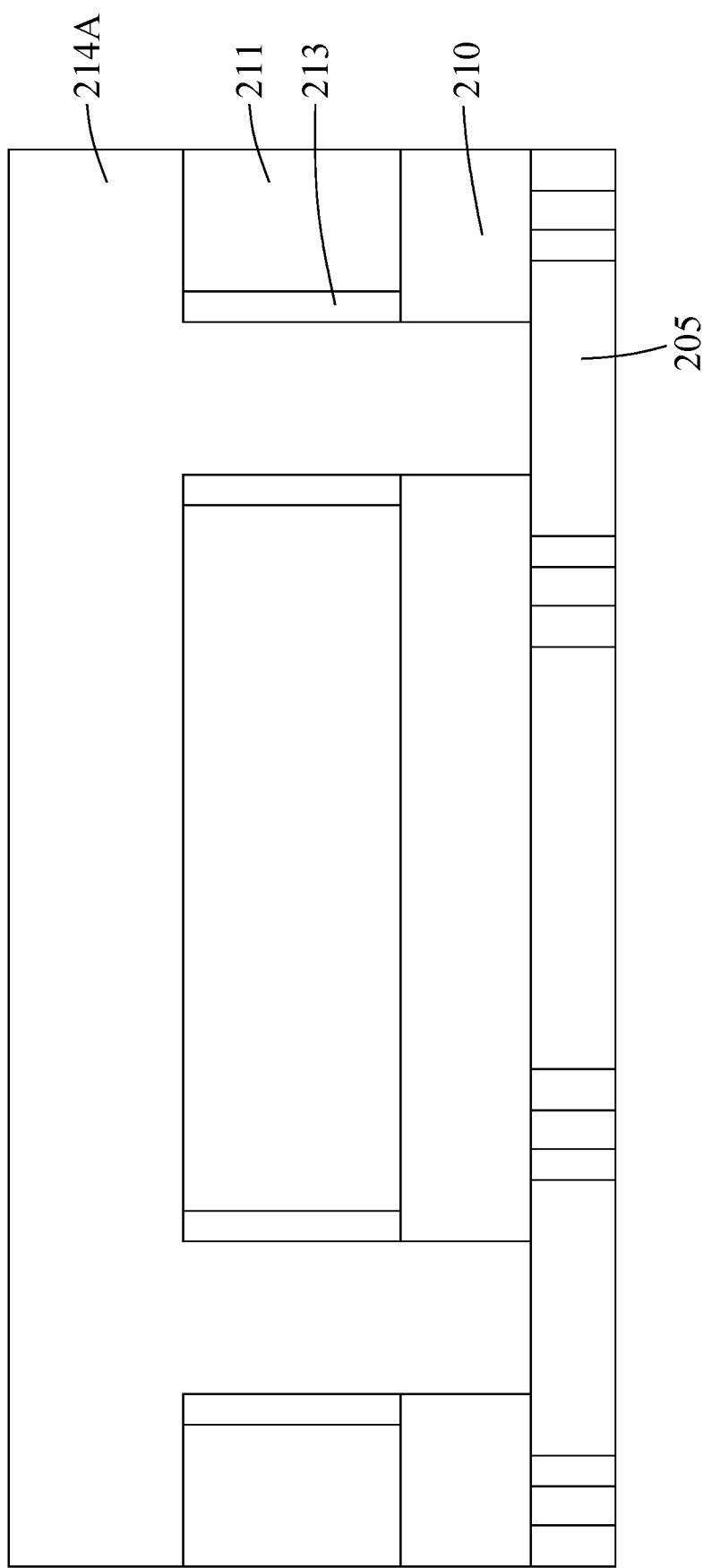

Referring to FIG. 16, subsequent to the process shown in FIG. 15, the conductive layer 214A is deposited on the second dielectric layer 211 and in the contact opening 212 (see FIG. 15) (i.e., process 112 in the flow chart 100 shown in FIG. 2). In some embodiments, the conductive layer 214A may be made of Ru, Rh, Ir, Co, W, Ta, TiN, TiW, Al, TaN, or Cu, any combination thereof, or other suitable materials.

In some embodiments, the conductive layer 214A may be formed by a suitable technique, such as ALD, CVD, PVD, or the like.

Figure 17:
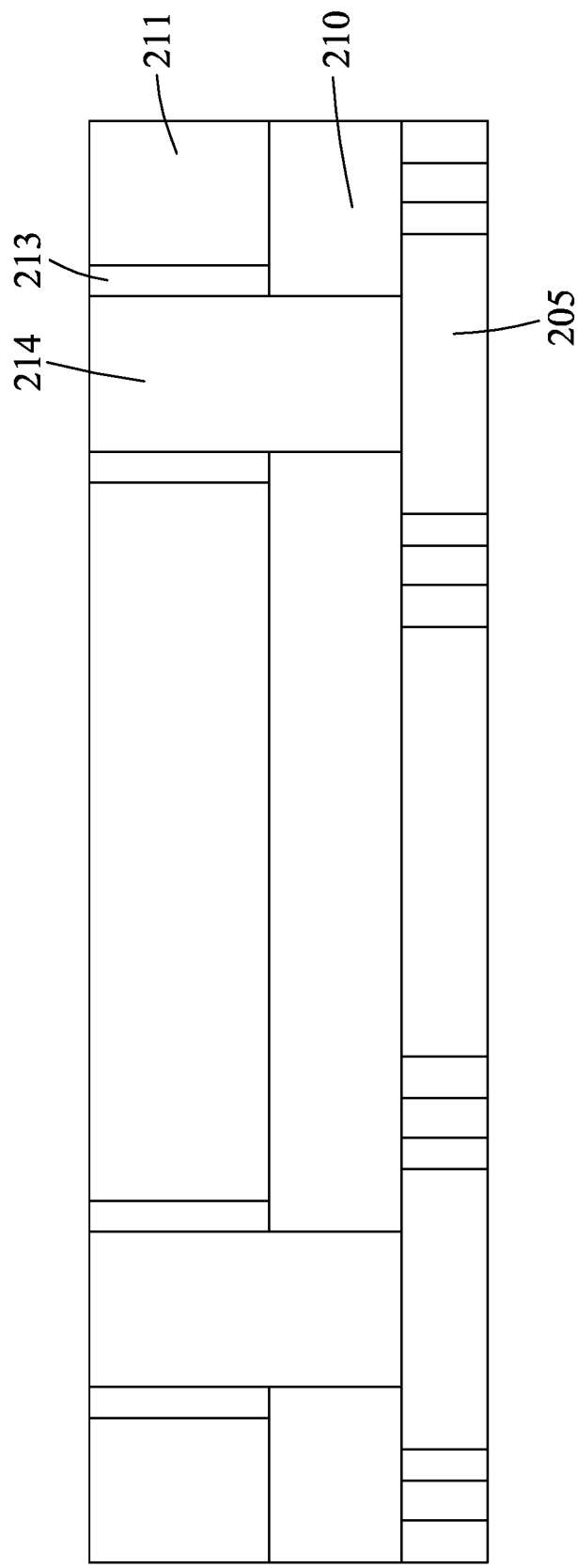

Referring to FIG. 17, subsequent to the process shown in FIG. 16, a part of the conductive layer 214A is removed to form the contact 214 in the contact opening 212 (see FIG. 15) (i.e., process 114 in the flow chart 100 shown in FIG. 2). In some embodiments, the part of the conductive layer 214A (see FIG. 16) is removed by a suitable technique, such as CMP or the like. FIG. 17 also illustrates that top portions of the second dielectric layer 211, the silicon nitride-based layer 213 and the conductive layer 214A in the contact opening 212 may also be removed. The height of the contact 214 may be adjusted according to practical requirements. Afterwards, process 116 in the flow chart 100 shown in FIG. 2 may be conducted to obtain the semiconductor device 300 (see FIG. 10).

Figure 18:
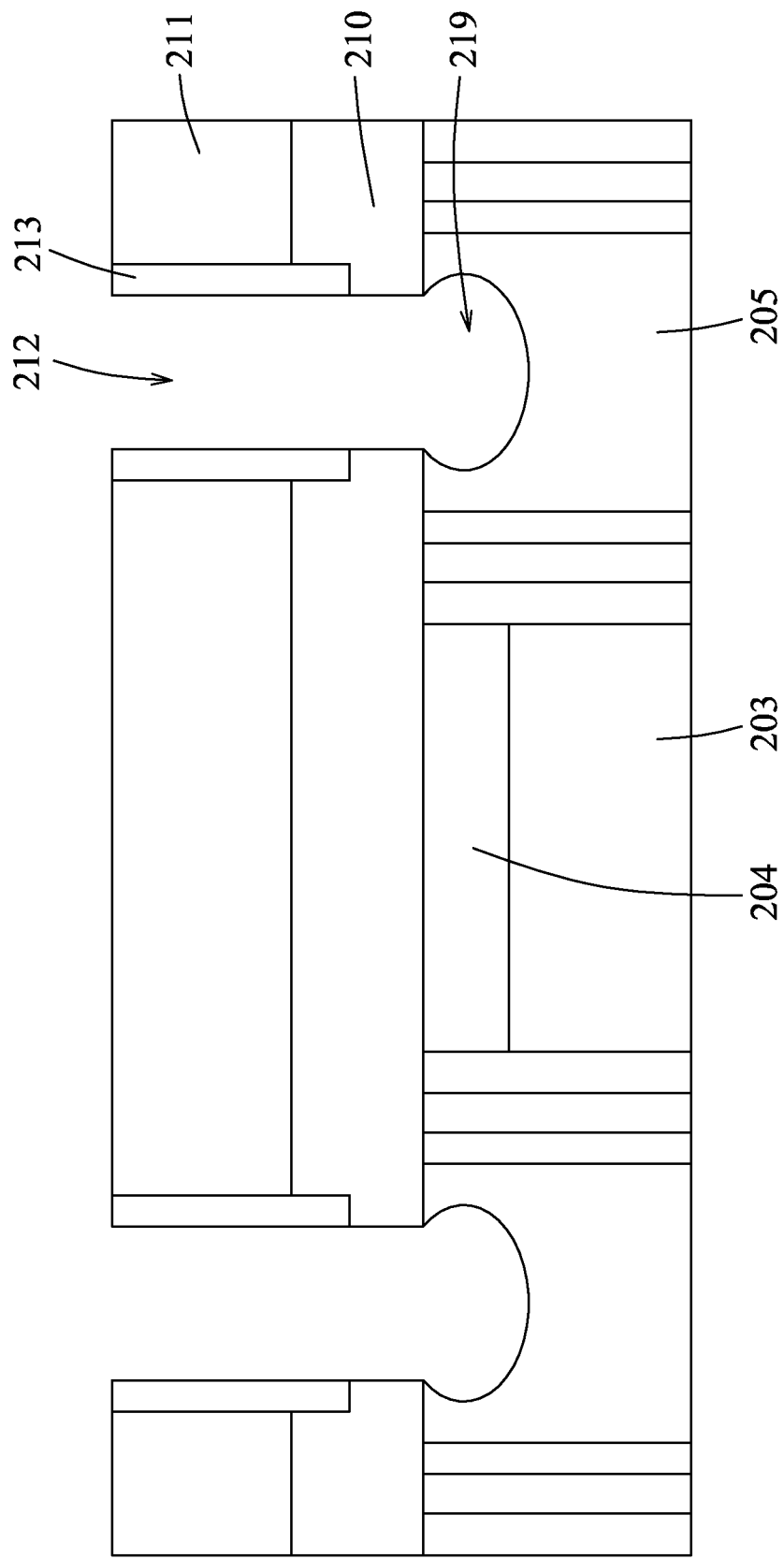
FIGS. 18 to 20 illustrate schematic sectional views of stages in the formation of a semiconductor device in accordance with some embodiments.

Referring to FIG. 18, in the step of etching the silicon nitride-based layer 213 and the etch stop layer 210 (i.e., process 110 in the flow chart 100 shown in FIG. 2), an undercut profile 219 may be formed in the conductive segment 205. In some embodiments, the undercut profile 219 may be formed by a suitable technique, such as exposing the conductive segment 205 to a dilute ammonia hydrogen peroxide mixture (APM) ($NH_4OH/H_2O_2/H_2O$ solution) or the like.

Figure 19:
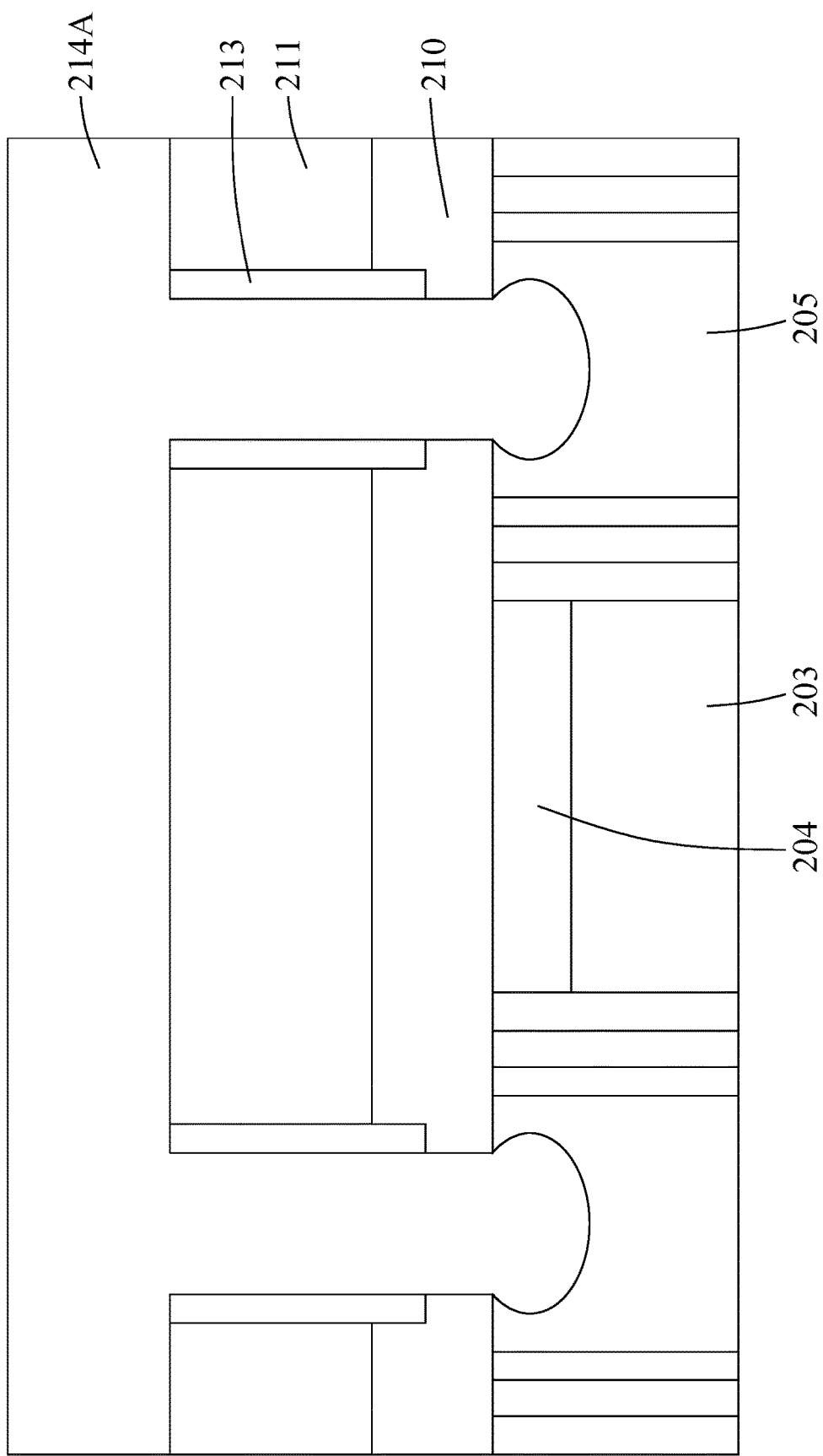

Referring to FIG. 19, subsequent to the process shown in FIG. 18, the conductive layer 214A is deposited on the second dielectric layer 211, and also in the contact opening 212 and the undercut profile 219 (see FIG. 18) (i.e., process 112 in the flow chart 100 shown in FIG. 2). In some embodiments, the conductive layer 214A may be made of Rh, Ir, Ta, Ru, Co, W, TaN, Ti, Al, any combination thereof, or other suitable materials. In some embodiments, the conductive layer 214A may be formed by a suitable technique, such as ALD, CVD, PVD, or the like.

Figure 20:
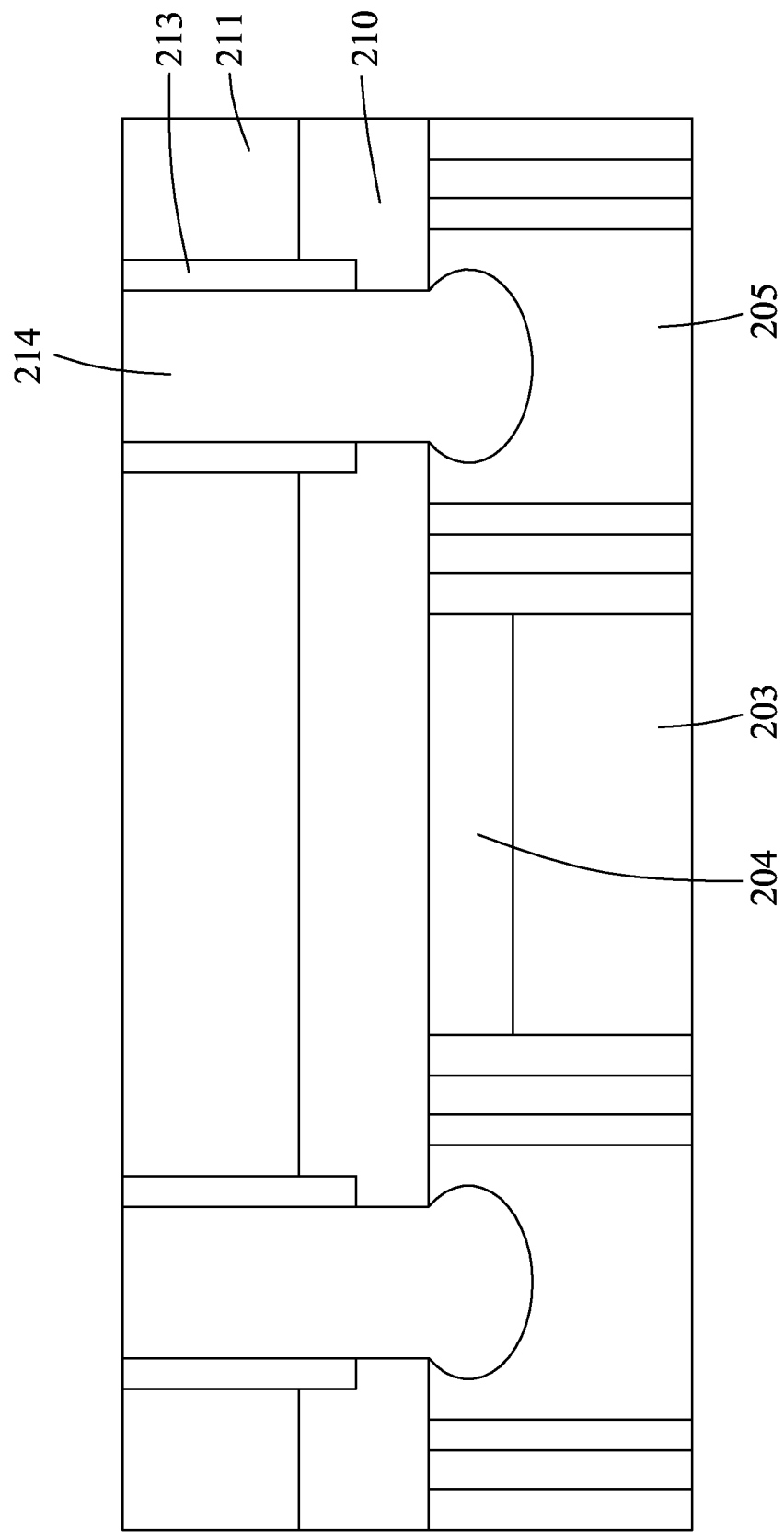

Referring to FIG. 20, subsequent to the process shown in FIG. 19, a part of the conductive layer 214A is removed to form the contact 214 in the contact opening 212 and the undercut profile 219 (see FIG. 18) (i.e., process 114 in the flow chart 100 shown in FIG. 2). In some embodiments, the part of the conductive layer 214A (see FIG. 19) is removed by a suitable technique, such as CMP or the like. FIG. 20 also illustrates that top portions of the second dielectric layer 211, the silicon nitride-based layer 213 and the conductive layer 214A in the contact opening 212 may also be removed. The height of the contact 214 may be adjusted according to practical requirements. Afterwards, process 116 in the flow chart 100 shown in FIG. 2 may be conducted to obtain the semiconductor device 300 (see FIG. 10). In some embodiments, the undercut profile 219 may provide increased contact area between the conductive segment 205 and the contact 214. Such increased contact area may allow the contact 214 to be more securely connected to the conductive segment 205, and may also reduce resistivity at the interface between the contact 214 and the conductive segment 205.

Figure 21:
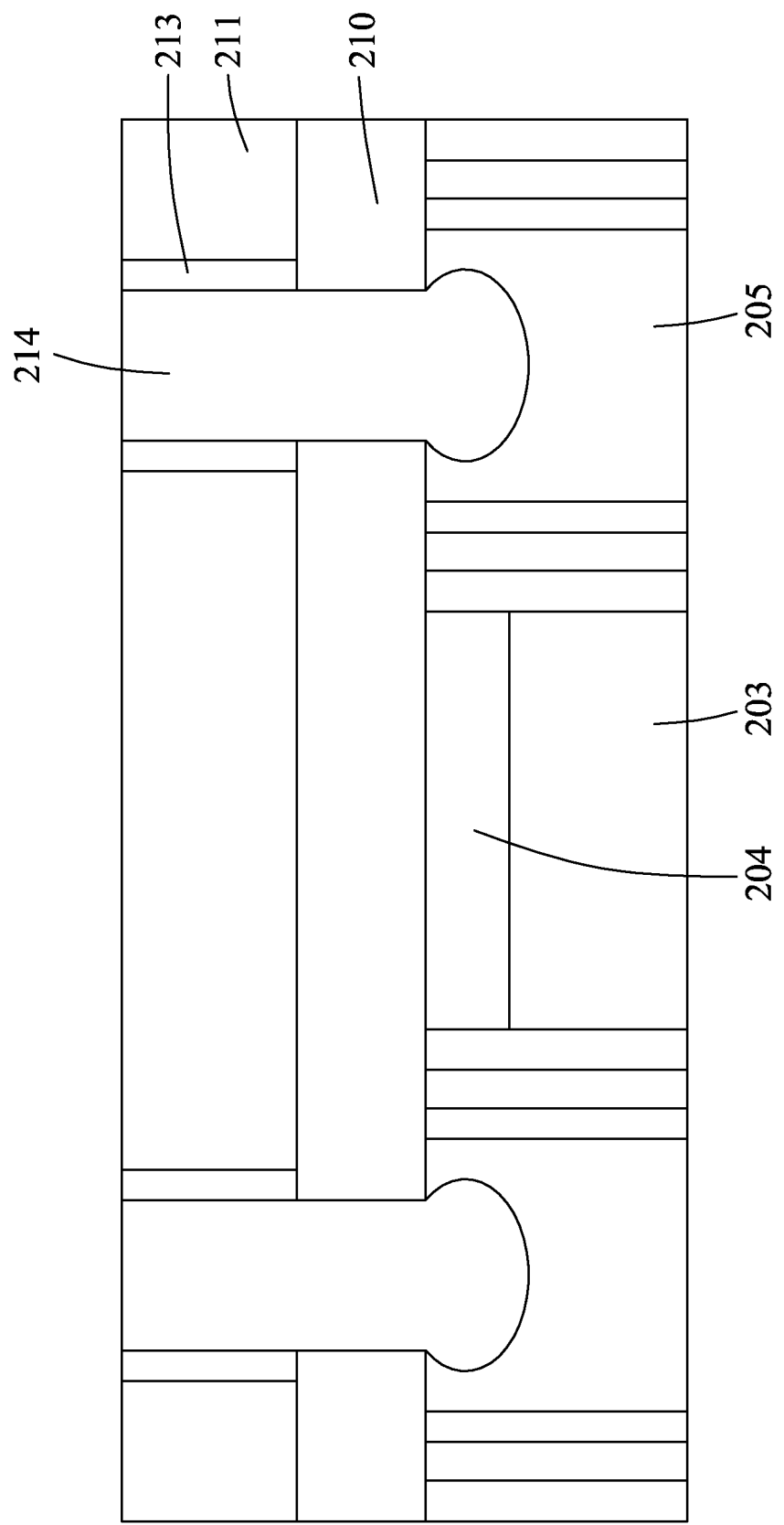
FIG. 21 is a schematic sectional view of a semiconductor device in accordance with some embodiments.

FIG. 21 illustrates a structure obtained by carrying out the following steps. Referring to FIG. 15, in the formation of the contact opening 212, the conductive segment 205 may be formed with the undercut profile 219 (see FIG. 18), followed by conducting processes 112 and 114 in the flow chart 100 shown in FIG. 2, so as to obtain the structure illustrated in FIG. 21. In such structure, the nitride-based layer 213 improves adhesion between the contact 214 and the second dielectric layer 211, and may serve as an anti-breakdown layer for the contact 214. In addition, the increased contact area between the contact 214 and the conductive segment 205 brought about by the undercut profile 219 reduces resistivity at the interface between the contact 214 and the conductive segment 205 and allows the conductive layers 214 to be more securely connected to the conductive segment 205.

The embodiments of the present disclosure have some advantageous features. The silicon nitride-based layer 213 improves adhesion between the contact 214 and the second dielectric layer 211. In some embodiments, the silicon nitride-based layer 213 may have a dielectric strength ranging from about 1 MV/cm to about 5 MV/cm, but other range values are also within the scope of this disclosure. Therefore, the silicon nitride-based layer 213 may serve as an anti-breakdown layer for preventing via-to-gate breakdown, via-to-via breakdown and via-to-MO breakdown.

In accordance with some embodiments, a semiconductor device includes a gate structure, a conductive segment, a second dielectric, a first contact, a second contact and a silicon nitride-based layer. The gate structure is disposed in a first dielectric layer. The conductive segment is disposed in the first dielectric layer and is separated from the gate structure. The second dielectric layer is disposed over the first dielectric layer. The first contact penetrates the second dielectric layer and is electrically connected to the gate structure. The second contact penetrates the second dielectric layer and is electrically connected to the conductive segment. The silicon nitride-based layer surrounds at least one of the first and second contacts and is connected between the second dielectric layer and the at least one of the first and second contacts.

In accordance with some embodiments, a semiconductor device includes a semiconductor substrate, two conductive segments, a gate structure, a first dielectric layer, a second dielectric layer, a gate contact, two source/drain contacts, a silicon nitride-based gate liner and two silicon nitride-based source/drain liners. The semiconductor substrate has a source region and a drain region. The conductive segments are respectively disposed over the source and drain regions. The gate structure is disposed over the semiconductor substrate and between the conductive segments. The first dielectric layer is disposed over the semiconductor substrate and surrounds the conductive segments and the gate structure. The second dielectric layer is disposed over the first dielectric layer. The gate contact penetrates the second dielectric layer and is electrically connected to the gate structure. The source/drain contacts penetrate the second dielectric layer and are electrically connected to the conductive segments, respectively. The silicon nitride-based gate liner surrounds the gate contact and is connected between the gate contact and the second dielectric layer. The silicon nitride-based source/drain liners respectively surround the source/drain contacts. Each of the silicon nitride-based source/drain liners is connected between a respective one of the source/drain contacts and the second dielectric layer.

In accordance with some embodiments, a method for making a semiconductor device includes: forming a gate structure and a conductive segment in a first dielectric layer, the gate structure and the conductive segment being separated from each other; forming an etch stop layer over the first dielectric layer; forming a second dielectric layer over the etch stop layer; forming an opening that penetrates the second dielectric layer into the etch stop layer, the opening being defined by a hole-defining wall that is constituted by the etch stop layer and the second dielectric layer; forming a silicon nitride-based layer on the hole-defining wall; removing a portion of the silicon nitride-based layer and a portion of the etch stop layer to expose one of the gate structure and the conductive segment; and filling the opening with a conductive structure in such a manner that the conductive structure is electrically connected to the exposed one of the gate structure and the conductive segment and that the silicon nitride-based layer surrounds the conductive structure and is connected between the conductive structure and the second dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for making a semiconductor device, comprising in sequential order of:

forming a source/drain region in a semiconductor substrate;

forming a gate structure and a conductive segment in a first dielectric layer, the first dielectric layer being disposed on the semiconductor substrate, the conductive segment being disposed to be in electrical contact with the source/drain region, the gate structure and the conductive segment being separated from each other;

forming an etch stop layer over the first dielectric layer opposite to the semiconductor substrate, the etch stop layer having a first part and a second part that is at a same level as the first part, the first part being disposed above the gate structure, the second part being in direct contact with the conductive segment;

forming a second dielectric layer over the etch stop layer;

forming an opening that penetrates the second dielectric layer into the etch stop layer in a manner that the second part of the etch stop layer is recessed and exposed from the opening, the recessed second part being disposed to prevent the conductive segment from being exposed from the opening;

forming a silicon nitride-based layer along an inner surface of the opening;

removing the recessed second part of the etch stop layer and a portion of the silicon nitride-based layer that is formed on the recessed second part of the etch stop layer so as to expose the conductive segment; and filling the opening with a conductive structure in such a manner that the conductive structure is in direct contact with the conductive segment and that the silicon nitride-based layer surrounds the conductive structure and is connected between the conductive structure and the second dielectric layer, wherein:

an upper surface of the gate structure is at a level which is not higher than an upper surface of the conductive segment;

the conductive segment is made of Co, W, Ru, Ti, Ta, or combinations thereof;

during formation of the silicon nitride-based layer, the silicon nitride-based layer is conformally formed along the inner surface of the opening and is further conformally formed on a top surface of the second dielectric layer; and during removal of the portion of the silicon nitride-based layer, another portion of the silicon nitride-bated layer is removed from the top surface of the second dielectric layer.

2. The method as claimed in claim 1, further comprising, after filling the opening with the conductive structure, a top portion of the second dielectric layer, a top portion of the silicon nitride-based layer, and a top portion of the conductive structure are removed.

3. The method as claimed in claim 1, wherein the silicon nitride-based layer includes a material of SiN, SiON, SiCN, or SiCON.

4. The method as claimed in claim 1, wherein the conductive structure is made of a material of Ru, Rh, Ir, Co, W, Ta, TiN, TiW, Al, TaN, or Cu.

5. The method as claimed in claim 1, wherein, for formation of the opening, the opening has a first portion formed in the etch stop layer and a second portion formed in the second dielectric layer, the first portion having a width that is not greater than a width of the second portion.

6. A method for making a semiconductor device, comprising in sequential order of:

forming a source/drain region in a semiconductor substrate;

forming a gate structure in a first dielectric layer, the first dielectric layer being disposed on the semiconductor substrate;

forming a conductive segment in the first dielectric layer, the conductive segment being separated from the gate structure and disposed to be in direct contact with the source/drain region;

forming an etch stop layer over the first dielectric layer, the etch stop layer having a first part and a second part that is at a same level as the first part, the first part being disposed above the gate structure, the second part being in direct contact with the conductive segment;

forming a second dielectric layer over the etch stop layer;

forming a first contact penetrating the second dielectric layer and the first part of the etch stop layer, the first contact being connected to the gate structure;

forming a second contact penetrating the second dielectric layer and the second part of the etch stop layer, the second contact being connected to the conductive segment; and forming a silicon nitride-based layer which extends from an upper surface of the second dielectric layer to terminate at an interior of the second part of the etch stop layer, and which surrounds the second contact, the silicon nitride-based layer having a distal portion and a proximal portion which are respectively located distal from and proximate to the conductive segment, the distal portion being connected between the second dielectric layer and the second contact, the proximal portion being connected between the etch stop layer and the second contact, the silicon nitride-based layer having a projection on an upper surface of the conductive segment in a direction normal to the upper surface of the conductive segment, the silicon nitride-based layer being separated from the conductive segment by the etch stop layer, wherein an upper surface of the gate structure is at a level which is not higher than an upper surface of the conductive segment; and the conductive segment is made of Co, W, Ru, Ti, Ta, or combinations thereof.

7. The method as claimed in claim 6, wherein the silicon nitride-based layer includes a material of SiN, SiON, SiCN, or SiCON.

8. The method as claimed in claim 6, wherein each of the first contact and the second contact is made of a material of Ru, Rh, Ir, Co, W, Ta, TiN, TiW, Al, TaN, or Cu.

9. The method as claimed in claim 6, wherein the silicon nitride-based layer has a width ranging from 0.1 nm to 10 nm.

10. The method as claimed in claim 9, wherein the second contact has a width ranging from 1 nm to 100 nm.

11. The method as claimed in claim 6, wherein the second contact has a first portion disposed in the etch stop layer and a second portion disposed in the second dielectric layer, the first portion having a width that is not greater than a width of the second portion.

12. The method as claimed in claim 6, wherein the etch stop layer and the silicon nitride-based layer are made of the same material.

13. A method for making a semiconductor device, comprising:
    forming a semiconductor substrate having a source region and a drain region;
    forming two conductive segments respectively over the source region and the drain region;
    forming a gate structure over the semiconductor substrate and between the two conductive segments;
    forming a first dielectric layer over the semiconductor substrate and surrounding the two conductive segments and the gate structure;
    forming an etch stop layer over the first dielectric layer, the etch stop layer having a first part and two second parts that are at a same level as the first part, the first part being disposed above the gate structure, the two second parts being in direct contact with the two conductive segment, respectively;
    forming a second dielectric layer over the etch stop layer;
    forming a gate contact penetrating the first part of the etch stop layer and the second dielectric layer, the gate contact being connected to the gate structure;
    forming two source/drain contacts each penetrating a respective one of the two second parts of the etch stop layer and each penetrating the second dielectric layer, the source/drain contacts being connected to the two conductive segments, respectively;
    forming a silicon nitride-based gate liner that extends from an upper surface of the second dielectric layer to terminate at an interior of the etch stop layer, and that surrounds the gate contact, the silicon nitride-based gate liner having a first distal portion and a first proximal portion which are respectively located distal from and proximate to the gate structure, the first distal portion being connected between the gate contact and the second dielectric layer, the first proximal portion being connected between the gate contact and the etch stop layer, the silicon nitride-based gate liner having a projection on an upper surface of the gate structure in a direction normal to the upper surface of the gate structure, the silicon nitride-based gate liner being separated from the gate structure by the first part of the etch stop layer;
    forming two silicon nitride-based source/drain liners that respectively extend from the upper surface of the second dielectric layer to terminate at the interior of the two second parts of the etch stop layer, and that respectively surround the two source/drain contacts, each of the two silicon nitride-based source/drain liners having a second distal portion and a second proximal portion which are respectively located distal from and proximate to a respective one of the two conductive segments, the second distal portion being connected between the second dielectric layer and a respective one of the two source/drain contacts, the second proximal portion being connected between the etch stop layer and the respective one of the two source/drain contacts, each of the two silicon nitride-based source/drain liners having a projection on an upper surface of the respective one of the two conductive segments in a direction normal to the upper surface of the respective one of the two conductive segments, each of the two silicon nitride-based source/drain liners being separated from the respective one of the two conductive segments by a respective one of the two second parts of the etch stop layer;
    forming a third dielectric layer over the second dielectric layer;
    forming a conductive structure in the third dielectric layer; and
    forming a glue layer such that the conductive structure is connected to at least one of the gate contact and the two source/drain contacts through the glue layer, the glue layer including a material of Ta, TaN, Co, Ru, Ti, TiN, $Mg_3N_2$, W, Al, Mo, Ir, Rh, graphene, SiN, SiON, SiCN, SiCON, or combinations thereof.

14. The method as claimed in claim 13 wherein:
    the two conductive segments and the gate structure are arranged in a first direction;
    the conductive structure has two conductive portions that extend along the first direction and that are spaced apart from each other in a second direction perpendicular to the first direction; and
    one of the two conductive portions is connected to the gate contact, and the other one of the two conductive portions is connected to the two source/drain contacts.

15. The method as claimed in claim 13, wherein each of the silicon nitride-based gate liner and the two silicon nitride-based source/drain liners includes a material of SiN, SiON, SiCN, or SiCON, and each of the two conductive segments is made of Co, W, Ru, Ti, Ta, or combinations thereof.

16. The method as claimed in claim 13, wherein each of the silicon nitride-based gate liner and the two silicon nitride-based source/drain liners has a width ranging from 0.1 nm to 10 nm.

17. The method as claimed in claim 16, wherein each of the two source/drain contacts has a width ranging from 1 nm to 100 nm.

18. The method as claimed in claim 13, wherein the silicon nitride-based gate liner and the two silicon nitride-based source/drain liners are formed after forming the two conductive segments.

* * * * *